US010732877B1

(12) United States Patent
Gopalakrishnan et al.

(10) Patent No.: US 10,732,877 B1
(45) Date of Patent: Aug. 4, 2020

(54) SMART MAPPING TABLE UPDATE POST BACKGROUND OPERATIONS

(71) Applicant: WESTERN DIGITAL TECHNOLOGIES, INC., San Jose, CA (US)

(72) Inventors: Raghavendra Gopalakrishnan, Bengaluru (IN); Nicholas Thomas, Edinburgh (GB); Karin Inbar, Ramat-Hasharon (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/364,054

(22) Filed: Mar. 25, 2019

(51) Int. Cl.
*G06F 3/06* (2006.01)
*G06F 12/02* (2006.01)
*G11C 11/56* (2006.01)

(52) U.S. Cl.
CPC ............ *G06F 3/064* (2013.01); *G06F 3/0611* (2013.01); *G06F 3/0679* (2013.01); *G06F 12/0246* (2013.01); *G11C 11/5621* (2013.01); *G06F 2212/7201* (2013.01); *G06F 2212/7203* (2013.01); *G11C 2211/5641* (2013.01); *G11C 2211/5643* (2013.01)

(58) Field of Classification Search
CPC ..... G06F 2212/7201; G06F 2212/7203; G11C 11/56–5692; G11C 2211/56–565
See application file for complete search history.

(56) References Cited

U.S. PATENT DOCUMENTS

| 9,892,033 | B1* | 2/2018 | Sabbag | G06F 12/0246 |
| 10,255,000 | B2* | 4/2019 | Sharma | G11C 16/28 |
| 2008/0209114 | A1* | 8/2008 | Chow | G06F 12/0804 711/103 |
| 2014/0189200 | A1* | 7/2014 | Gavens | G06F 12/0607 711/103 |
| 2015/0006784 | A1* | 1/2015 | Avila | G06F 12/0246 711/103 |

(Continued)

*Primary Examiner* — Nathan Sadler
(74) *Attorney, Agent, or Firm* — Morgan, Lewis & Bockius LLP

(57) ABSTRACT

In one embodiment, there is a method for managing data in a storage device comprising a non-volatile memory having a plurality of jumbo blocks, each jumbo block having a separate and distinct physical block address. The method comprises performing a folding operation data associated with a first virtual address from a plurality of Single Level Cell (SLC) jumbo blocks of the non-volatile memory to one Multilevel Cell (MLC) jumbo block of the non-volatile memory, receiving a read request to read data associated with a first logical block address, identifying that the first virtual address is associated with the first logical block address, determining whether a jumbo block associated with the first logical block address meets pre-SLC-overwrite criteria. In response to a determination that the jumbo block associated with the first logical block address meets pre-SLC-overwrite criteria, reading data from the SLC jumbo block associated with the first virtual address. In response to a determination that the jumbo block associated with the first logical block address does not meet pre-SLC-overwrite criteria, reading data from the MLC jumbo block associated with the first virtual address.

20 Claims, 6 Drawing Sheets

(56) References Cited

U.S. PATENT DOCUMENTS

| | | | |
|---|---|---|---|
| 2015/0186259 A1* | 7/2015 | Thomas | G06F 12/0246 711/103 |
| 2015/0255150 A1* | 9/2015 | Kim | G11C 11/16 365/148 |
| 2016/0141047 A1* | 5/2016 | Sehgal | G11C 16/3427 365/185.02 |
| 2016/0162357 A1* | 6/2016 | Desireddi | G06F 11/1068 714/764 |
| 2017/0286291 A1* | 10/2017 | Thomas | G06F 12/0253 |
| 2018/0293014 A1* | 10/2018 | Ravimohan | G06F 3/061 |

* cited by examiner

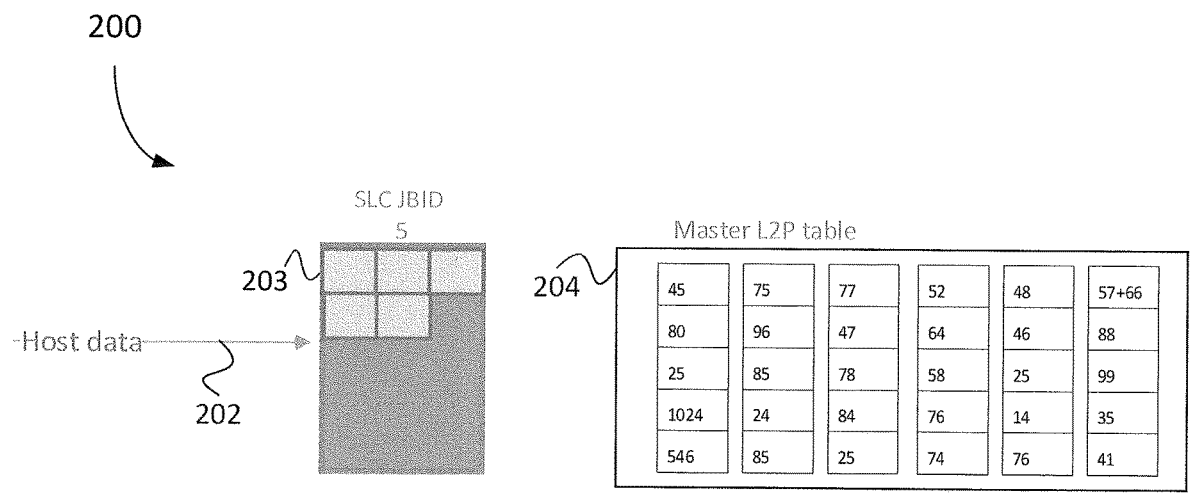
Figure 2A
Figure 2B
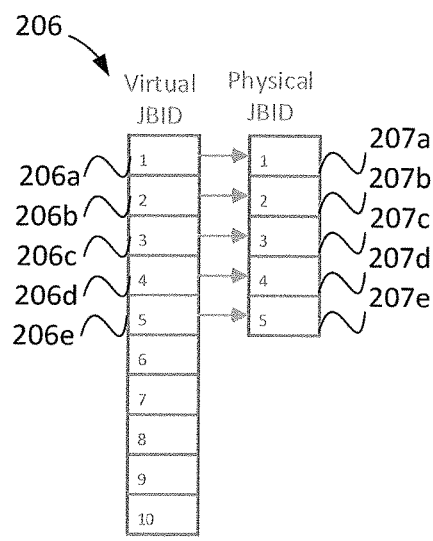
Figure 2C

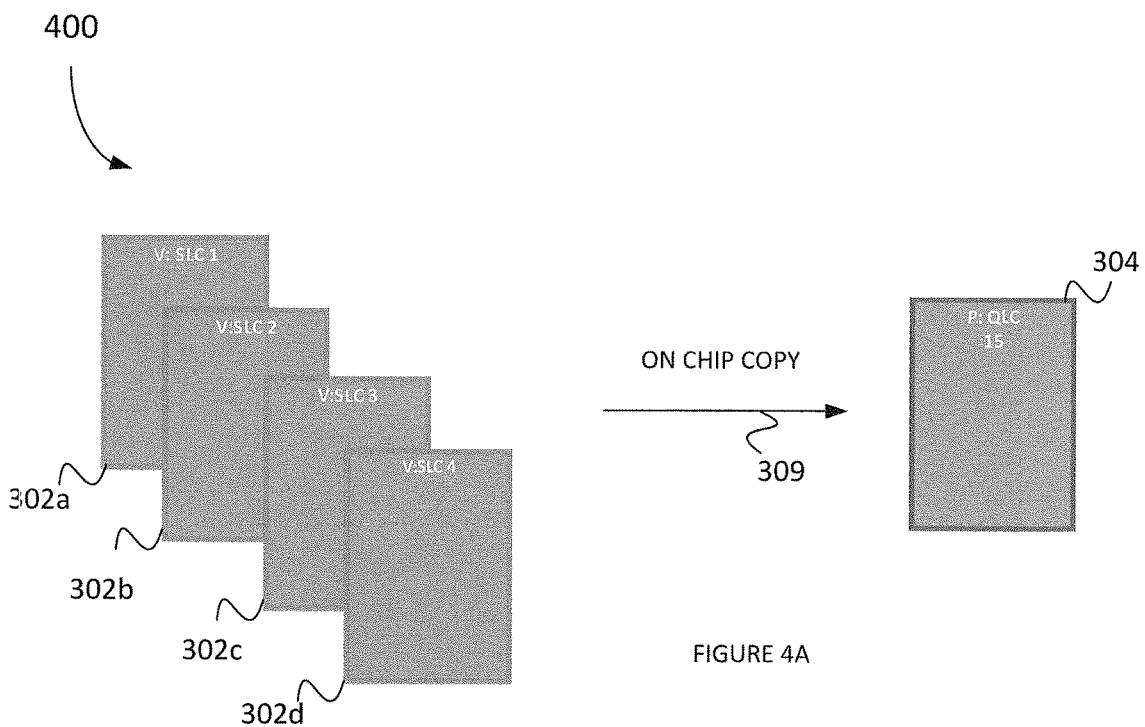
FIGURE 4A
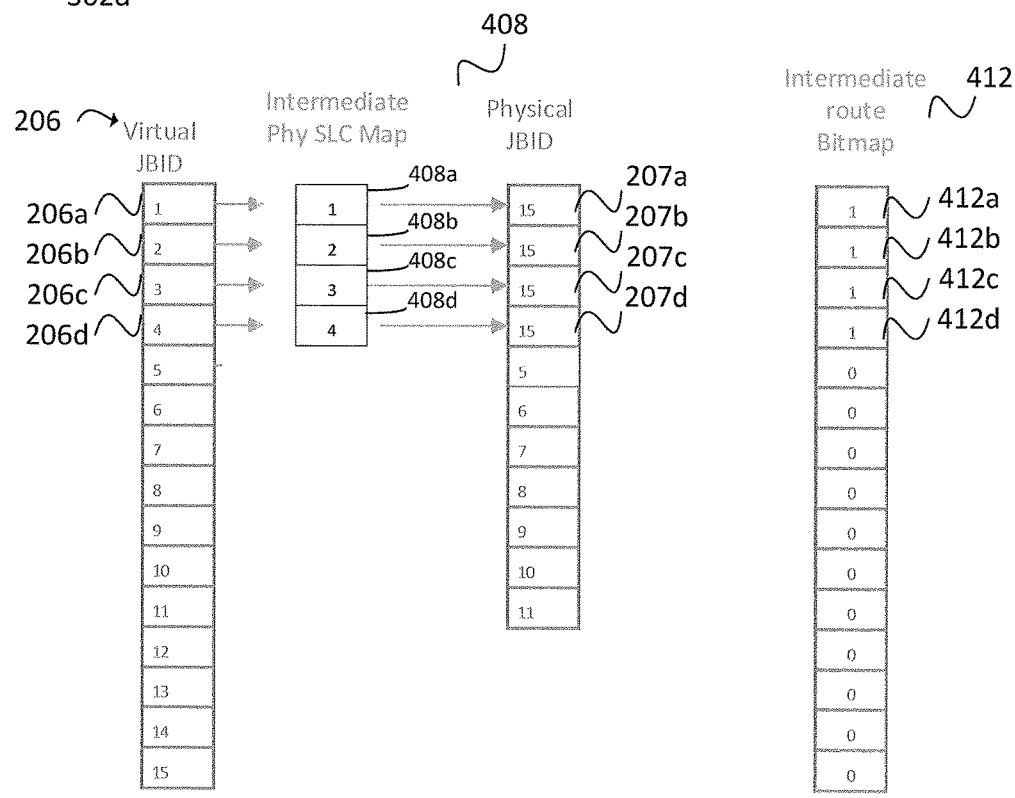
FIGURE 4B
FIGURE 4C

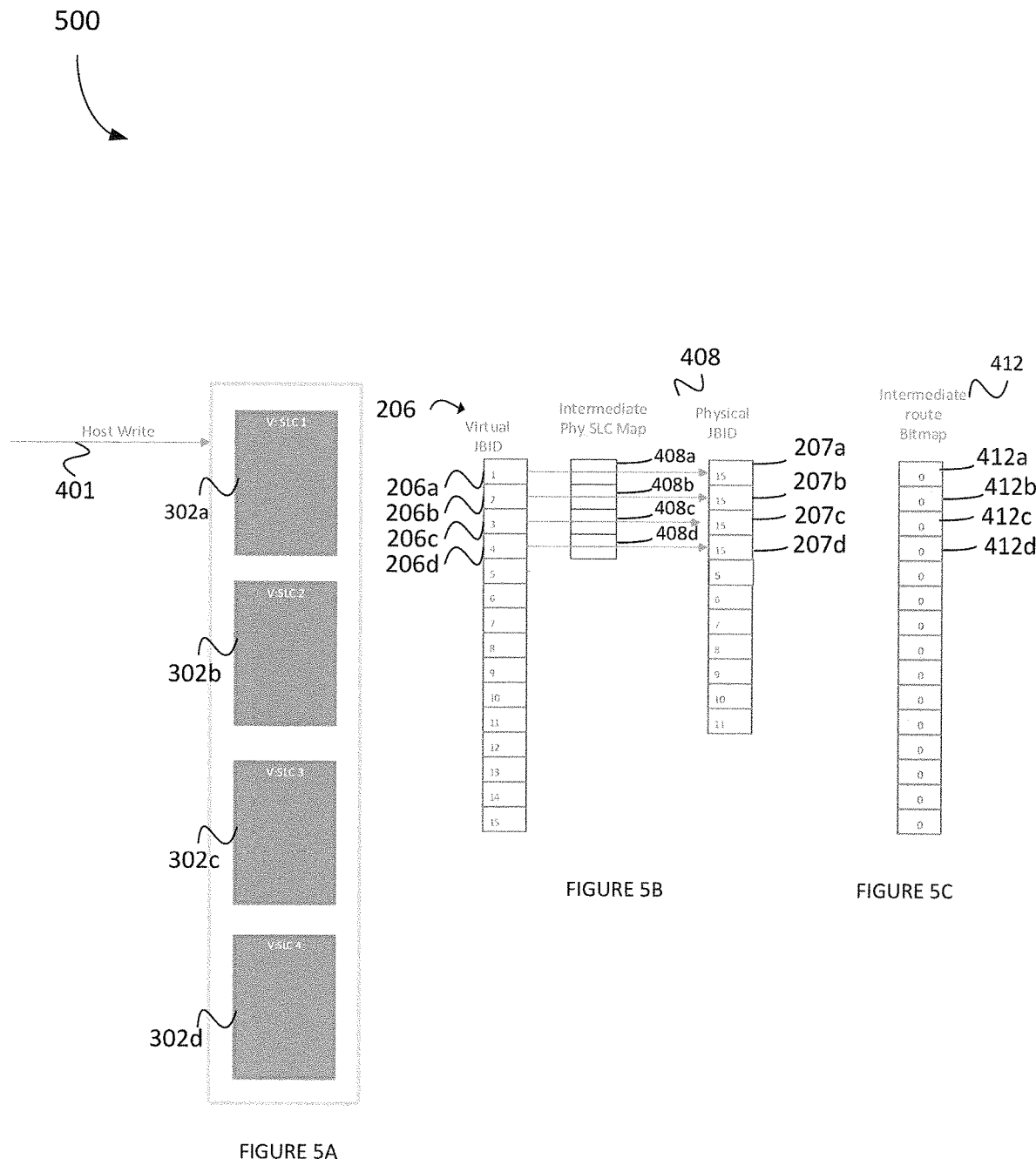

SMART MAPPING TABLE UPDATE POST BACKGROUND OPERATIONS

BACKGROUND

Semiconductor memory devices or solid-state drives (SSD) and controllers thereof typically utilize memory cells to store data as an electrical value, such as an electrical charge or voltage. A memory cell, for example, includes a single transistor with a floating gate that is used to store a charge representative of a data value. Memory is a non-volatile data storage device that can be electrically erased and reprogrammed. More generally, non-volatile memory (e.g., flash memory, as well as other types of non-volatile memory implemented using any of a variety of technologies) retains stored information even without power, as opposed to volatile memory, which requires power to maintain the stored information.

The semiconductor devices may be configured to include blocks (or groups, or groups of blocks referred to herein as jumbo blocks) of single-level cell (SLC) non-volatile memory units and/or multi-level cell (MLC) (e.g., dual-level, triple-level, quad-level, or any other non-single level cell) memory units. There are performance tradeoffs with each type of memory cell. For example, MLCs store more data per cell than SLCs, but MLCs degrade more quickly and have longer read times for data requests. In some instances, to conserve memory space, the semiconductor devices may transfer data from a set of SLC blocks to a single MLC block. The semiconductor devices may be configured to conduct X2 or higher programming on a set of SLC blocks by using a folding operation/process (e.g., on-chip copy operation or copy through controller operation). In a folding process, a set of SLC blocks which have a high validity count may be selected for folding to the target MLC block. As part of the folding process, the SLC partition data may be moved to the MLC block to make space for the next set of host writes. However, subsequent reads after the background operation may suffer since the host read may be directed to the MLC blocks instead of the SLC blocks, which are inherently faster for memory reads than MLC blocks.

Thus, there is a need for an efficient semiconductor device and controller thereof that optimize use of all blocks in the memory in the most efficient manner.

SUMMARY

Without limiting the scope of the appended claims, after considering this disclosure, and particularly after considering the section entitled "Detailed Description," one will understand how the aspects of various embodiments are implemented and used to manage data in a storage device while accommodating high host write speed and high host read speed by optimizing the use of SLC and MLC blocks.

BRIEF DESCRIPTION OF THE SEVERAL VIEWS OF THE DRAWINGS

The foregoing summary, as well as the following detailed description of embodiments of the disclosed invention, will be better understood when read in conjunction with the appended drawings of an exemplary embodiment. It should be understood, however, that the invention is not limited to the precise arrangements and instrumentalities shown.

In the drawings:

FIGS. 2A-2C are block diagrams illustrating a representation of data storage management in a storage device using logical-to-physical mapping tables and virtual-to-physical mapping tables, in accordance with an exemplary embodiment of the present invention;

FIGS. 4A-4C are block diagrams illustrating a method of data storage management via intermediate mapping tables, in accordance with an exemplary embodiment of the present invention;

FIGS. 5A-5C are block diagrams illustrating a method of data storage management via intermediate mapping tables, in accordance with an exemplary embodiment of the present invention.

DETAILED DESCRIPTION

In some embodiments, to accommodate high host write speed on the semiconductor device using SLC blocks, data from SLC blocks may be relocated to MLC blocks using a folding process described herein to free up the SLC blocks for further data read/write operations. However, host read performance may be negatively impacted as a result because the MLC blocks are inherently slower when executing read operations. In some embodiments, to improve host read speeds, host data may reside in both SLC and MLC for a period of time until the SLC blocks are written to in subsequent write operations for further memory storage. As such, at least some embodiments of the present invention may provide a method and system of storage management and accommodating high host write speed and high host read speed by optimizing the use of SLC and quad-level cell (QLC) (or any MLC) blocks and utilizing the SLC blocks after the folding process and before a subsequent write operation is performed.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure pertinent aspects of the embodiments described herein.

Figure 1:
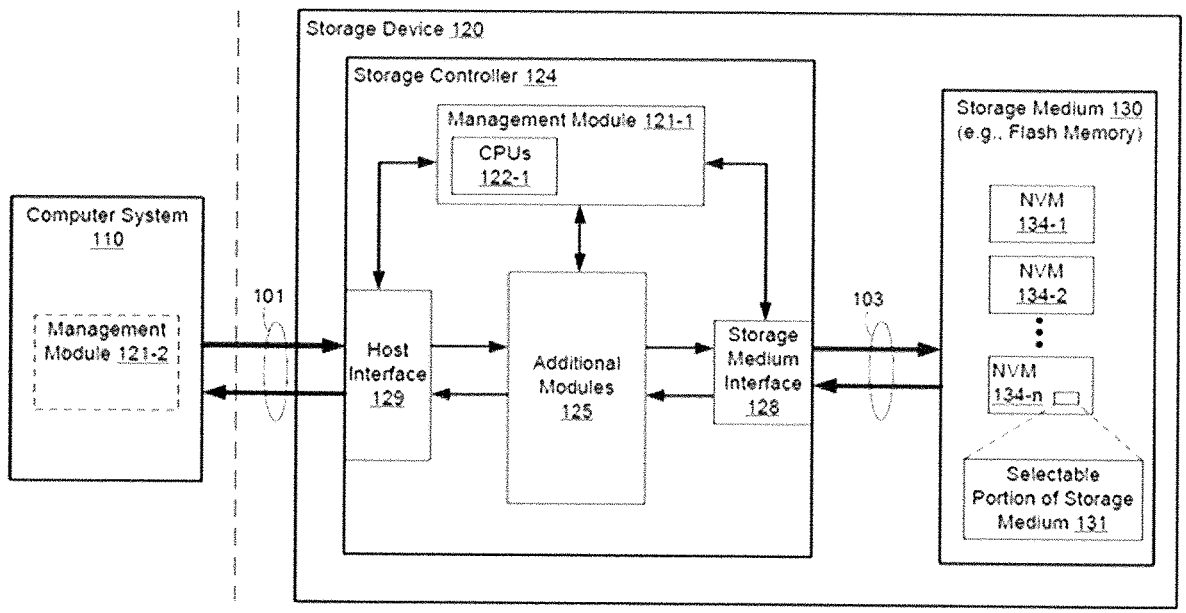
FIG. 1 is a block diagram illustrating an implementation of a data storage system, in accordance with some embodiments.

Referring to FIG. 1, there is shown a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120 (also sometimes called an information storage device, or a data storage device, or a memory device), which includes a storage controller 124 and a storage medium 130, and is used in conjunction with or includes a computer system 110

(e.g., a host system or a host computer). In some embodiments, storage medium 130 is a single memory device while in other embodiments storage medium 130 includes a plurality of memory devices. In some embodiments, storage medium 130 is NAND-type flash memory or NOR-type flash memory. In some embodiments, storage medium 130 includes one or more three-dimensional (3D) memory devices. In some embodiments, the memory cells of storage medium 130 are configured to store two or three bits per memory cell. Further, in some embodiments, storage controller 124 is a solid-state drive (SSD) controller. However, other types of storage media may be included in accordance with aspects of a wide variety of embodiments (e.g., Phase Change Random-Access Memory (PCRAM), Resistive Random Access Memory (ReRAM), Spin-Transfer Torque Random-Access Memory (STT-RAM), Magnetoresistive Random-Access Memory (MRAM), etc.). In some embodiments, a memory device includes one or more memory die, one or more memory packages, one or more memory channels or the like. In some embodiments, data storage system 100 includes one or more storage devices 120.

Computer system 110 is coupled to storage controller 124 through data connections 101. However, in some embodiments computer system 110 includes storage controller 124, or a portion of storage controller 124, as a component and/or as a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch-screen display, a mouse, a track-pad, a digital camera, and/or any number of supplemental I/O devices to add functionality to computer system 110. In some embodiments, computer system 110 does not have a display and other user interface components.

Storage medium 130 is coupled to storage controller 124 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 124 and storage medium 130 are included in the same device (i.e., an integrated device) as components thereof. Furthermore, in some embodiments, storage controller 124 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices 134-i including, without limitation, persistent memory or non-volatile semiconductor memory devices, such as flash memory device(s). For example, memory device(s) can be configured for enterprise storage suitable for applications such as cloud computing, for database applications, primary and/or secondary storage, or for caching data stored (or to be stored) in secondary storage, such as hard disk drives. Additionally, and/or alternatively, memory device(s) can also be configured for relatively smaller-scale applications such as personal drives or hard-disk replacements for personal, laptop, and tablet computers. In some embodiments, each memory device 134-i includes multiple groups of cells of a certain data type (e.g., SLC or MLC), organized as "blocks" of memory units. A block as used herein may refer to a unit of memory between 256 KB and 8 MB using similar types of memory cells. These blocks of data may be further organized into groups referred to herein as "jumbo blocks." A jumbo block as used herein may refer to a unit of memory between 192 MB and 1 GB.

Memory devices 134-i of storage medium 130 may include addressable and individually selectable blocks, such as selectable portion 131 of storage medium 130 (also referred to herein as selected portion 131). In some embodiments, the individually selectable blocks (sometimes called erase blocks) are the minimum size erasable units in a memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the memory device.

In some embodiments, storage controller 124 includes a management module 121-1, a host interface 129, a storage medium interface 128, and additional module(s) 125. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Host interface 129 typically includes an input buffer and output buffer, not shown. Similarly, storage medium Interface 128 provides an interface to storage medium 130 though connections 103. In some embodiments, storage medium Interface 128 includes read and write circuitry, including circuitry capable of providing reading signals to storage medium 130 (e.g., reading threshold voltages for NAND-type flash memory).

In some embodiments, management module 121-1 includes one or more processing units 122-1 (sometimes herein called CPUs, processors, or hardware processors, and sometimes implemented using microprocessors, microcontrollers, or the like) configured to execute instructions in one or more programs (e.g., in management module 121-1). In some embodiments, the one or more CPUs 122-1 are shared by one or more components within, and in some cases, beyond the function of storage controller 124. Management module 121-1 is coupled to host interface 129, additional module(s) 125 and storage medium Interface 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

In some embodiments, additional module(s) 125 include an error control module, provided to limit the number of uncorrectable errors inadvertently introduced into data during writes to memory or reads from memory. In some embodiments, the error control module is executed in software by the one or more CPUs 122-1 of management module 121-1, and, in other embodiments, the error control module is implemented in whole or in part using special purpose circuitry to perform data encoding and decoding functions. To that end, in some embodiments, the error control module includes an encoder and a decoder. The encoder encodes data by applying an error control code to produce a codeword, which is subsequently stored in storage medium 130.

When the encoded data (e.g., one or more codewords) is read from storage medium 130, the decoder applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

The storage controller 124 is configured to perform sensing operations (e.g., read operations or also referred to herein as wear leveling operation) (WrL). A read operation is initiated when computer system (host) 110 sends one or more host read commands (e.g., via data connections 101) to storage controller 124 requesting data from one or more pools 134-i of storage medium 130. Storage controller 124 sends one or more data access commands to storage medium 130, via storage medium interface 128, to obtain raw read data in accordance with memory locations (addresses at specific pools) specified by the one or more host read commands. Storage medium interface 128 provides the raw read data (e.g., comprising one or more codewords) to the decoder. If the decoding is successful, the decoded data is provided to an output buffer, where the decoded data is made available to computer system 110. In some embodiments, if the decoding is not successful, storage controller 120 may resort to a number of remedial actions or provide an indication of an irresolvable error condition.

Referring to FIGS. 2A-2C, there is shown a representation 200 for managing data in a storage device. Specifically, in FIG. 2A there is shown an SLC jumbo block 203. A jumbo block may be configured to store one or more blocks of memory units (e.g., SLC or MLC), as described herein. In this example, SLC jumbo block 203 is configured to store one or more blocks of SLC memory units. As used herein, a jumbo block may be referred to as a meta block or super block. While the exemplary embodiment uses jumbo blocks, it is contemplated that other memory units may be used (e.g., block, page, etc.) in different embodiments. The storage device may include one or more jumbo blocks. To differentiate between jumbo blocks, each jumbo block may be assigned an identifier. In this example, the SLC jumbo block has an identifier 5 ("five").

In one embodiment, the computer system 110 may send a request to a storage controller 124 to access SLC jumbo block 203 located in storage medium 130. The request to access SLC jumbo block 203 may include host data 202 which may include a logical block address indirectly associated with the identifier for the SLC jumbo block 203. As used herein, the term logical block address may refer to a logical address tracked by the host controller 110 that specifies where a certain portion of data is stored in the storage medium 130. The host data 202 may specify whether the access request is a request to read data to SLC jumbo block 203 or write data to SLC jumbo block 203. The storage controller 124 may process the request by extracting the logical block address from the host data 202 and performing the operation specified by the host data 202.

After extracting the logical block address from the host data 202 in the request, the storage controller 124 may match the logical block address with a corresponding jumbo block physical address using one or more tables storing the associations between logical block addresses and corresponding jumbo block physical addresses. One or more tables may be utilized to allow the storage controller 124 to reorganize data into different blocks without requiring the storage controller 124 to inform the host controller 110 of any changes in data locations. In this example, two different tables are used. The first table is a referred to herein as a master L2P table 204. The master L2P table 204, while generally referring to the correlations or associations between logical addresses tracked by the host controller 110 and physical addresses of data in storage medium 130, can also be used to associate logical addresses to corresponding virtual addresses. These virtual addresses can then be converted into physical addresses using a second table, such as virtual-to-physical table 206 shown in FIG. 2C. As explained herein, by using multiple tables, the storage controller 124, in addition to moving data between blocks to balance usage of physical memory units, may also perform folding operations, where data is transferred from a memory unit of one data type (e.g., SLC) to a memory unit of another data type (e.g., QLC). In this example, after matching the logical block address with a corresponding virtual jumbo block address (e.g., jumbo block identifier 5) specified in the master L2P table 204, the storage controller 124 may use the virtual jumbo block address to match the virtual jumbo block address to a corresponding physical jumbo block address in virtual-to-physical table 206. In this example, the virtual block address ("5") for SLC jumbo block is shown by the fifth entry 206e on the virtual table portion of virtual-to-physical table 206. In one embodiment, the physical block address for SLC jumbo block 203 is shown by the fifth entry 207e in physical table portion 207 of the virtual-to-physical table 206. Arrows between entries of the virtual table portion and the physical table portion represent how each of the entries are associated. For example, an arrow from the fifth entry 206e of the virtual table portion virtual-to-physical table 206 to the fifth entry 207e of the physical table portion of virtual-to-physical table 206 represents that there is an association between the fifth entry 206e of the virtual table portion virtual-to-physical table 206 and the fifth entry 207e having the identifier specified in the physical table portion of the virtual-to-physical table 206. Other arrows are also shown linking entry of the virtual table portion of the virtual-to-physical table 206 to entry of the physical table portion of the virtual-to-physical table 206. Using the fifth entry 206e of the virtual table portion virtual-to-physical table 206 to identify the fifth entry 207e of the physical table portion of virtual-to-physical table 206, the storage controller 124 determines that the logical block address from the original request in the host data 202 corresponds to physical jumbo block with an identifier of five ("5") specified in the virtual-to-physical table 206. The storage controller 124 may then perform the operation specified in the original request from the host controller 110 on the jumbo block having the identifier of five ("5"). For example, the storage controller 124 may read data from, or write data to, the jumbo block having the identifier of five ("5").

In some embodiments, the master L2P table 204 and/or the virtual-to-physical table 206 may be stored in one or more suppressed control blocks of storage medium 130. In one embodiment, the suppressed control block may be an SLC block. By using a master L2P table 204 and virtual-to-physical table 206, large amounts of data may be stored in smaller storage capacities (e.g., 32 megabytes of information being stored in 32 kilobytes of the master L2P table 204).

In one embodiment, if the host data 202 specifies that data is to be written to a physical jumbo block, once the data is written to the respective physical jumbo block, the master L2P table 204 may be updated to include a table entry that associates the logical address specified in the host data 202 to the virtual address specified in the virtual-to-physical table 206. Optionally, if the host data 202 specifies that data is to be written to a physical jumbo block, once the data is written to the respective physical jumbo block, the virtual-to-physical table 206 may be updated to include a table entry that associates the virtual address specified by the master L2P table 204 to the physical address specified in the virtual-to-physical table 206 that identifies where the data is stored.

Figure 3A:
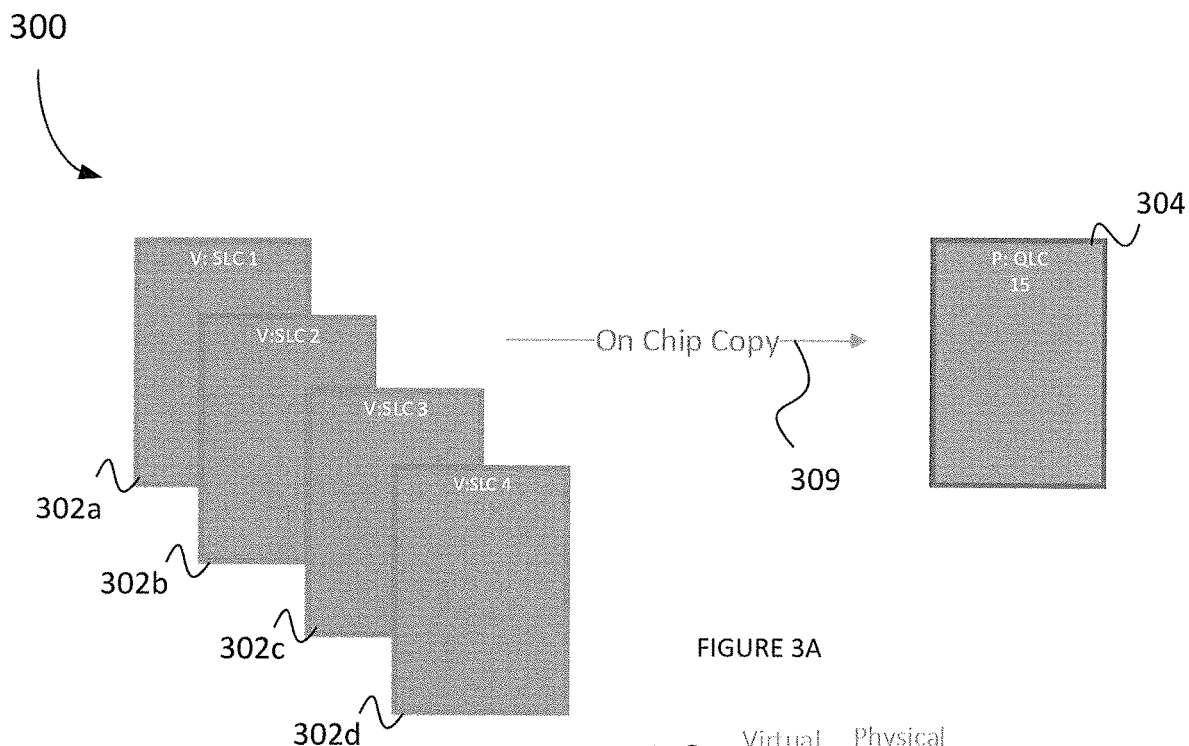
FIGS. 3A and 3B are block diagrams illustrating a method of data storage management where a virtual-to-physical mapping table is updated in response to a folding process, in accordance with an exemplary embodiment of the present invention.
Figure 3B:
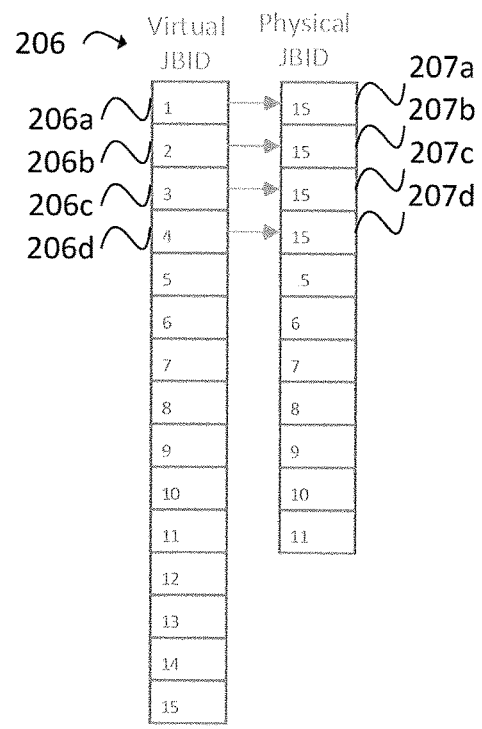

Referring to FIGS. 3A and 3B, there are shown block diagrams illustrating a representation 300 of data storage management where a virtual-to-physical mapping table (e.g., virtual-to-physical table 206) is updated in response to performance of a folding process operation. Specifically, FIG. 3A shows a storage controller 124 performing an on-chip copy (OCC) operation 309 to transfer data from four SLC jumbo blocks 302, having physical addresses one ("1") to four ("4") respectively, to a single QLC jumbo block 304, having a physical address of fifteen ("15"). In one embodiment, the data is mapped to lower, middle, upper and top pages of the QLC jumbo block 304. In this embodiment, the L2P table is not updated. After a successful OCC operation 309, the master L2P table 204 shown in FIG. 2 is not updated. Instead, the virtual-to-physical table 206 shown in FIG. 3B is updated. This is shown in FIG. 3B, as entries 206a-d of the virtual portion of the virtual-to-physical table 206 having virtual addresses 1 through 4 are mapped to entries 207a-d of the physical portion of virtual-to-physical table 206 illustrate that virtual addresses one ("1") to four ("4") representing the four SLC jumbo blocks 302 of FIG. 3A map to physical address fifteen ("15") representing the QLC jumbo block 304 of FIG. 3A. After the folding operation 309, in response to subsequent requests for data previously stored at one of the four SLC jumbo blocks 302 in FIG. 3A, the storage controller 124 may retrieve data from the QLC jumbo block 304 after referencing the virtual-to-physical table 206 and identifying that data previously stored at one of the four SLC jumbo blocks 302 (referenced as one ("1") to four ("4") in the entries 206a-d of the virtual portion of the virtual-to-physical table 206) is now stored in the QLC jumbo block 304 (referenced as fifteen ("15") in the entries 207a-d of the physical portion of the virtual-to-physical table 206).

Referring to FIGS. 4A-4C, there are shown block diagrams illustrating a representation 400 of data storage management using intermediate mapping tables. While some example features are illustrated, various other features have not been illustrated for the sake of brevity and so as not to obscure pertinent aspects of the example embodiments disclosed herein. Specifically, FIG. 4A, similar to FIG. 3A, shows a storage controller 124 performing an on-chip copy (OCC) operation 309 to transfer data from four SLC jumbo blocks 302, having physical addresses one ("1") to four ("4") respectively, to a single QLC jumbo block 304, having a physical address of fifteen ("15"). FIG. 4B shows the virtual-to-physical table 206 being updated as the entries 206a-d in virtual addresses storing one ("1") to four ("4") representing the four SLC jumbo blocks 302 map to entries 207a-d storing physical address fifteen ("15") representing the QLC jumbo block 304. In some embodiments, the storage controller 124 may also include an intermediate physical SLC mapping table 408 and/or an intermediate route bitmap 412. As explained below, the intermediate physical SLC mapping table 408 and/or the intermediate route bitmap 412 may be utilized by the storage controller 124 to access the original physical SLC jumbo blocks should the data still be valid in the physical SLC jumbo blocks. By utilizing and accessing valid data from the SLC jumbo blocks, the storage controller 124 may improve performance by performing read commands on the physical SLC jumbo blocks specified in entries 408a-d rather than using the QLC jumbo block specified in entries 207a-d. The intermediate physical SLC mapping table 408 and/or the intermediate route bitmap 412 may be stored in storage medium 130 and accessed by storage controller 124. The storage controller 124, via intermediate physical SLC mapping table 408, may be configured to track an association between entries 206a-d of the virtual portion of the virtual-to-physical table 206 and the corresponding entries 207a-d of the physical portion of the virtual-to-physical table 206 before a folding operation (e.g., on-chip copy operation or copy through controller operation) is performed (e.g., as shown in FIG. 2C). For example, in FIG. 4B, entry 408a of intermediate physical SLC mapping table 408 showing an original physical address of one ("1") corresponds to entry 206a of a virtual portion of the virtual-to-physical table 206 showing an original virtual address of one ("1"). If the data is still valid (e.g., the data at the SLC jumbo blocks have not been subsequently overwritten as described in FIGS. 6A-6C), the storage controller 124 may identify the physical SLC jumbo blocks that stored the valid data before the folding operation occurred and access these physical SLC jumbo blocks accordingly for read operations. However, because there is now a 2-to-1 mapping from the entries 206a-d to entries 408a-d and entries 207a-d, the storage controller 124 may need to track which entries to access in response to an operation request specified by the host controller 110. As shown in FIG. 4C, the storage controller 124 may utilize an intermediate route bitmap 412 to identify whether associations between entries (e.g., entries 206a-d) in the virtual portion of virtual-to-physical table 206 corresponding to entries (e.g., entries 408a-d) in the intermediate physical SLC mapping table 408 that are still valid and have not been overwritten. To identify that the associations between entries (e.g., entries 206a-d) in the virtual portion of virtual-to-physical table 206 corresponding to entries (e.g., entries 408a-d) in the intermediate physical SLC mapping table 408 are still valid, the storage controller 124 may introduce a flag for a corresponding entry in the intermediate bitmap 412. For example, the association between the entries 408*a-d* in intermediate physical SLC table 408 and the entries 206*a-d* may be tracked in the corresponding entries 412*a-d* in intermediate route bitmap 412. For example, entry 412*a* in intermediate route bitmap 412 may be marked with a "1" to indicate that the association between entry 408*a* in the intermediate physical SLC table 408 and entry 206*a* in the virtual-to-physical table 206 is still valid and the value in entry 408*a* (e.g., physical address one ("1")) should be used to access a physical SLC jumbo block at the physical address in storage medium 130 to retrieve the pertinent data. In another example, entry 412*a* in intermediate route bitmap 412 may be marked with a "0" to indicate that the association between entry 408*a* in the intermediate physical SLC table 408 and entry 206*a* in the virtual-to-physical table 206 is no longer valid (e.g., the data at physical SLC address has been overwritten) and the value in entry 408*a* (e.g., physical address one ("1")) should be used to access a physical SLC jumbo block at the physical address in storage medium 130 to retrieve the pertinent data. As such, when a read request is received by the storage controller 124 and the storage controller 124 obtains a virtual block address (e.g., an address as specified at entry 206*a*) from the master L2P table 204 in FIG. 2B, the storage controller 124 may check for the existence of a flag in a corresponding entry 412*a* of intermediate route bitmap 412. If the storage controller 124 identifies a flag for the corresponding entry 412*a*, the storage controller 124 may read from the physical address specified in entry 408*a* in the intermediate physical SLC table 408 to retrieve the physical SLC jumbo block address specified therein. If the storage controller 124 does not identify a flag for the corresponding entry 412*a*, the storage controller 124 may read from the physical address specified in entry 207*a* in the physical portion of the virtual-to-physical table 206 to retrieve the physical QLC jumbo block address specified therein. By utilizing the intermediate physical SLC table 408 and optionally the intermediate route bitmap 412, such utilization significantly reduces host read time by leveraging physical SLC blocks with valid data, where applicable.

Referring now to FIGS. 5A-5C, there is shown a block diagram representation 500 of managing data in storage devices where data in physical SLC jumbo blocks previously referenced in virtual-to-physical table 206 is no longer valid after a subsequent write operation is performed. As shown in FIG. 5A, a host write operation 401 is performed on SLC jumbo blocks 302*a-d* by the storage controller 124. These SLC jumbo blocks 302*a-d* may have corresponding virtual addresses as specified in entries 206*a-d*. In response to performing host write operation 401, the storage controller 124 may clear the flag in the corresponding entries 412*a-d* in the intermediate route bitmap 412. Clearing of intermediate route bitmap 412 may be shown with all entries 412*a-d* being marked as "0". In response to clearing intermediate route bitmap 412, entries 408*a-d* in intermediate physical bitmap 408 may also be represented as cleared. The representative clearing of entries 408*a-d* in intermediate physical SLC map 408 may be represented herein by no value being present in entries 408*a-d* in intermediate physical SLC map 408. In operation, while there may be values present in entries 408*a-d*, these values are disassociated from the virtual-to-physical table 206 and may be ignored by the storage controller 124. As a result of the flag being cleared, the storage controller 124 will identify the corresponding entries 207*a-d* in the physical portion of the virtual-to-physical table 206 to access data instead of being directed to the intermediate route bitmap 412.

While a "1" is used to indicate the association between corresponding entries in the intermediate physical SLC table 408 and the virtual-to-physical table 206, in some embodiments other flags may be used to identify that the entry in the intermediate physical SLC table 408 should be used for access operations.

Figure 6:
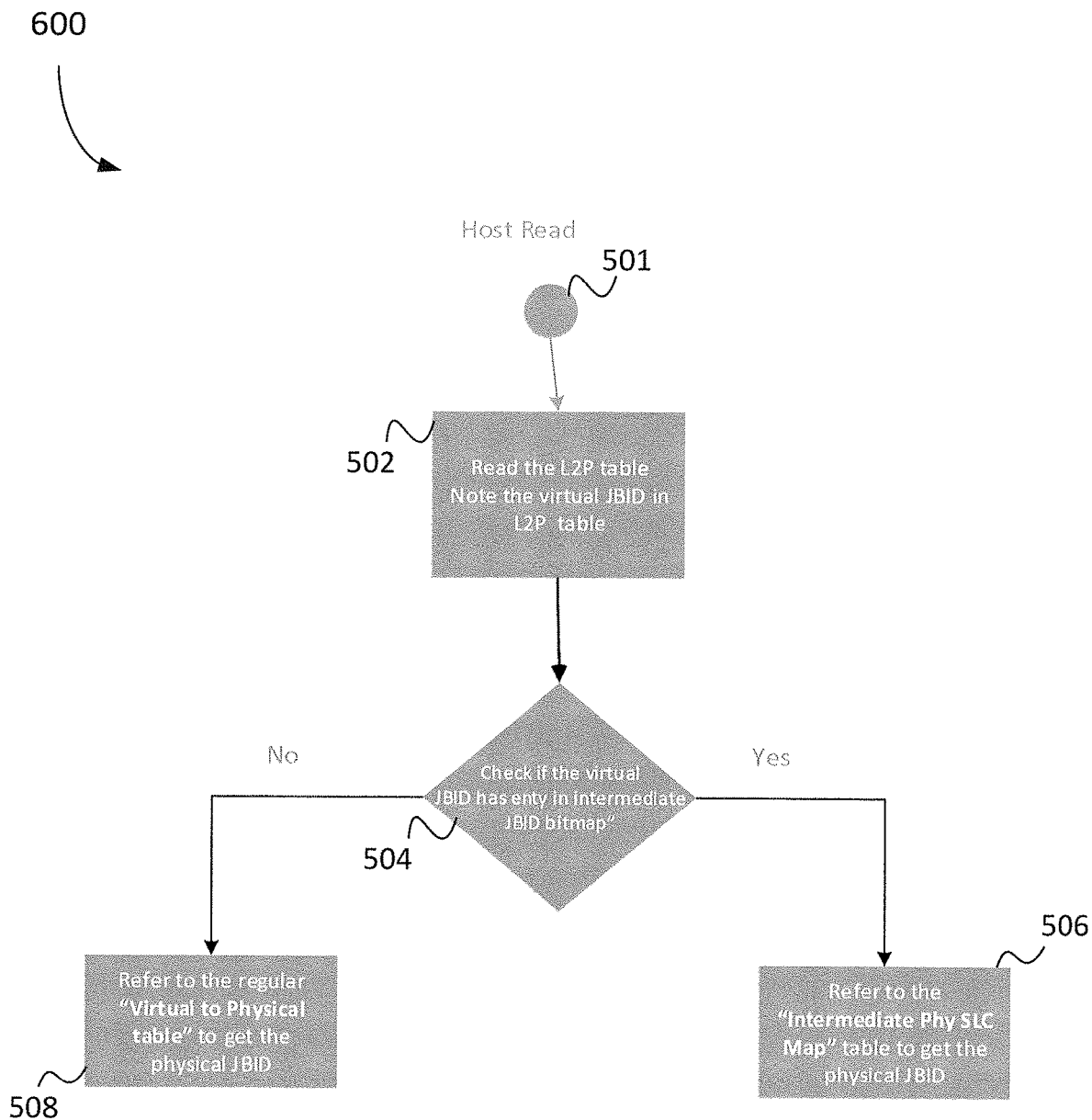
FIG. 6 is a flow chart illustrating a method of data storage management, in accordance with an exemplary embodiment of the present invention.

Referring to FIG. 6, there is shown a flow chart illustrating a method 600 of managing data in a storage device. The method of managing data may comprise a non-volatile memory having a plurality of jumbo blocks (or other types of memory units, such as blocks generally). Each jumbo block may have a separate and distinct physical block address. A physical address may be defined as the physical location of data in storage memory 130. For example, as shown in FIG. 4A, each SLC jumbo block 302*a-d*, has a separate and distinct physical block address of "1", "2", "3" and "4" respectively. The method 600 may be implemented using the computer system 110 (e.g., a host system), storage controller 124 and storage medium 130 of FIG. 1. However, in other aspects, other components may be utilized to implement one or more of the steps of method 600.

Initially, the storage controller 124 may be configured to perform an on-chip copy of data from a plurality of SLC jumbo blocks of the non-volatile memory to one multilevel cell (MLC) jumbo block of the non-volatile memory. For example, as shown in FIG. 4A, on chip copy operation 309 is performed on SLC jumbo blocks 302*a-d* to transfer data stored in the SLC jumbo blocks 302*a-d* to QLC jumbo block 304. The data may be associated with a first virtual address. For example, as shown in FIG. 4A, the virtual address for the data is the virtual address of "1", "2", "3" and "4" for SLC jumbo blocks 302*a-d*. The first virtual address may be referenced in a logical-to-physical table (e.g., master L2P table 204). The first virtual address may refer to a virtual location of data referenced by a logical-to-physical table. In one embodiment, the storage controller 124 may be configured to, in response to performing the on-chip copy operation, update a virtual-to-physical mapping to associate the respective virtual address for the data with the physical address of the MLC jumbo block, rather than the SLC jumbo blocks. For example, as shown in FIGS. 4A-4B, after performing on-chip copy operation 309 on SLC jumbo blocks 302*a-d*, the virtual to physical mapping (e.g., virtual-to-physical table 206) associated with the virtual addresses for SLC jumbo blocks 302*a-d* may be updated to associate with the physical address of QLC jumbo block 304.

The storage controller may be configured to receive a read (501) request to read data associated with a first logical block address. For example, as shown in FIGS. 2A-2C, a read request represented as host data 202 may be received by storage controller 124 to read data associated with a logical block address.

In response to receiving the read request, the storage controller 124 may identify (502) that the first virtual address is associated with the first logical block address. For example, as shown in FIG. 2B, the storage controller 124 may identify a first virtual address by referencing a logical-to-physical table (e.g., master L2P 204).

The storage controller 124 may determine (504) whether a jumbo block associated with the first logical block address meets pre-SLC overwrite criteria. In one embodiment, a pre-SLC-overwrite criteria may be a criterion that is met when the SLC jumbo block corresponding to the logical block address has not been overwritten since an on-chip copy operation has been performed. For example, as shown in FIGS. 4A-4B, upon receiving a read request to read data associated with SLC jumbo block 302a, the storage controller may determine that SLC jumbo block 302a meets pre-SLC-overwrite criteria because the SLC jumbo block 302a has not been overwritten. However, as shown in FIGS. 5A-5B, upon receiving a read request to read data associated with SLC jumbo block 302a, the storage controller 124 may determine that the SLC jumbo block 302a does not meet pre-SLC-overwrite criteria because the SLC jumbo block 302a has been overwritten.

The storage controller 124 may determine that the jumbo block associated with the first logical block address meets pre-SLC-overwrite criteria, and as a result, the storage controller 124 may read (506) data from the SLC jumbo block associated with the first virtual address. For example, as shown in FIGS. 4A-4B, if the storage controller 124 receives a read request for data at a certain logical block address where the data continues to be stored in SLC jumbo block 302a even after the folding operation, the storage controller 124 may read data from SLC jumbo block 302a since the SLC jumbo block 302a has not been overwritten. To track which SLC jumbo blocks still contain valid data after a folding operation, the storage controller 124 may maintain a virtual-to-intermediate-physical SLC table (e.g., intermediate physical SLC mapping table 408) which may include a correspondence between the first virtual address specified in the host data of a read request and a physical address of a corresponding SLC jumbo block. For example, as shown in FIG. 4B, intermediate physical SLC map 408 may include a correspondence between entry 206a stored in of the virtual-to-physical table 206 and having a virtual block identifier of "1" and entry 408a stored in of the intermediate physical SLC mapping table 408 and having an identifier of "1" for the specific SLC jumbo block that still contains valid data after a folding operation. In some embodiments, if pre-SLC-overwrite criteria is met, the storage controller 124 may reference the virtual-to-intermediate-physical SLC table to retrieve the physical address of the SLC jumbo block to read the data associated with the logical address. The storage controller 124 may also maintain an intermediate route mapping (e.g., intermediate route bitmap 412) which may indicate whether there is an SLC jumbo block associated with the first virtual address, subject to a folding operation, with valid data that has not yet been overwritten. For example, as shown in FIG. 4C, intermediate route bitmap 412 includes entries 412a-d, which each indicate whether the SLC jumbo block indicated in the intermediate physical SLC mapping table 408 for a particular entry 408a-d should be used instead of entry 207a-d in the physical portion of the virtual-to-physical table 206, which in this example is a QLC jumbo block identified as "15". In some embodiments, pre-SLC-overwrite criteria may include a criterion that is met when the intermediate route mapping indicates that there is an SLC jumbo block associated with the first virtual address with retrievable valid data. For example, as shown in FIG. 4C, entries in the intermediate route bitmap 412 may be marked with a "1", to indicate that intermediate physical SLC mapping table 408 should be used to retrieve the data since the particular SLC jumbo block referenced in the intermediate physical SLC mapping table 408 includes valid data. Entries in the intermediate route bitmap 412 may be marked with a "0", to indicate that virtual-to-physical table 206 should be used to retrieve the data since the particular SLC jumbo block referenced in the intermediate physical SLC mapping table 408 no longer includes valid data.

The storage controller 124 may determine that the jumbo block associated with the first logical block address does not meet pre-SLC-overwrite criteria, and as a result, the storage controller 124 may read (508) data from the MLC jumbo block associated with the first virtual address. For example, as shown in FIGS. 5A-5B, if the storage controller 124 receives a read request for data at a certain logical block address where the data was previously, but is no longer, stored in SLC jumbo block 302a after the OCC operation (e.g., OCC operation 309) due to a subsequent data overwrite, the storage controller 124 may read data from QLC jumbo block 304 (shown in FIG. 4A) since the SLC jumbo block 302a has not been overwritten. In some embodiments, if pre-SLC-overwrite criteria is not met, the storage controller 124 may reference the physical portion (e.g., any of entries 207a-d) of the virtual-to-physical table 206 to retrieve the physical address of the SLC jumbo block to read the data associated with the logical address.

In one embodiment, after a folding operation, the storage controller 124 may be configured to receive a write request (i.e., host write 401 shown in FIG. 5A) to overwrite certain SLC jumbo blocks before receiving a read request for data previously stored in the respective SLC jumbo blocks. For example, as shown in FIG. 5A, a write request 401 is received to write data to SLC jumbo blocks 302a-d. In response to receiving the write request, the storage controller 124 may write data to the SLC jumbo block associated with the virtual block address as specified in the intermediate physical SLC mapping table 408. In one embodiment, because the respective SLC jumbo block no longer contains data associated with the virtual block address, the storage controller 124 may be required to update the intermediate route mapping (i.e., intermediate route bitmap 412) to indicate that data in the SLC jumbo block disassociated with the first virtual address is no longer valid and therefore the pre-SLC-overwrite criteria can no longer be met. For example, as shown in FIG. 5B, arrows flowing from entries 206a-d to 207a-d through intermediate physical SLC mapping table 408 may indicate that intermediate physical SLC mapping table 408 is not applicable after the write operation. Intermediate route bitmap entries 412a-d are marked with "0" to indicate that data in SLC jumbo blocks 302a-d have been disassociated with the first virtual address and no longer contain retrievable valid.

In at least one embodiment, there is included one or more computers having one or more processors and memory (e.g., one or more nonvolatile storage devices). In some embodiments, memory or computer readable storage medium of memory stores programs, modules and data structures, or a subset thereof for a processor to control and run the various systems and methods disclosed herein. In one embodiment, a non-transitory computer readable storage medium having stored thereon computer-executable instructions which, when executed by a processor, perform one or more of the methods disclosed herein.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

We claim:

1. A method for managing data in a storage device comprising a non-volatile memory having a plurality of jumbo blocks, each jumbo block having a separate and distinct physical block address, the method comprising:
performing a folding operation on data associated with a first virtual address from a plurality of Single Level Cell (SLC) jumbo blocks of the non-volatile memory to one Multilevel Cell (MLC) jumbo block of the non-volatile memory;
receiving a read request to read data associated with a first logical block address;
identifying that the first virtual address is associated with the first logical block address;
determining whether a jumbo block associated with the first logical block address meets pre-SLC-overwrite criteria:
in response to a determination that the jumbo block associated with the first logical block address meets pre-SLC-overwrite criteria, reading data from the SLC jumbo block associated with the first virtual address;
in response to a determination that the jumbo block associated with the first logical block address does not meet pre-SLC-overwrite criteria, reading data from the MLC jumbo block associated with the first virtual address.

2. The method of claim 1, wherein pre-SLC-overwrite criteria includes a criterion that is met when the SLC jumbo block corresponding to the logical block address has not been overwritten since the performing of the folding operation.

3. The method of claim 1, further comprising:
maintaining a virtual-to-intermediate-physical mapping of the correspondence between the first virtual address and physical address of a corresponding SLC jumbo block;
maintaining an intermediate route mapping indicating whether there is an SLC jumbo block associated with the first virtual address with retrievable data;
wherein pre-SLC-overwrite criteria includes a criterion that is met when the intermediate route mapping indicates that there is an SLC jumbo block associated with the first virtual address with retrievable data; and
in response to a determination that the intermediate route mapping indicates that there is an SLC jumbo block associated with the first virtual address with retrievable data, and before reading data from the SLC jumbo block associated with the first virtual address:
identifying the physical address of the SLC jumbo block from the virtual-to-intermediate physical mapping.

4. The method of claim 3, further comprising:
before receiving the read request, receiving a write request to write data to the non-volatile memory, and in response to receiving the write request:
writing data to the SLC jumbo block associated with the virtual block address and disassociating the SLC block with the virtual block address; and
updating the intermediate route mapping to indicate that data in the SLC jumbo block disassociated with the first virtual address is no longer retrievable such that the pre-SLC-overwrite criteria cannot be met.

5. The method of claim 1, further comprising:
maintaining a logical-to-virtual mapping of the correspondence between the respective logical and virtual address for each jumbo block of data and maintaining a virtual-to-physical mapping of the correspondence between the respective virtual and physical address for each jumbo block of data.

6. The method of claim 5, further comprising: in response to performing the folding operation, updating the virtual-tophysical mapping to associate the respective virtual address for the data with the physical address of the MLC jumbo block.

7. The method of claim 6,
in response to a determination that the jumbo block associated with the first logical block address does not meet pre-SLC-overwrite criteria, and before reading data from the MLC jumbo block associated with the first virtual address:
identifying the physical address of the MLC jumbo block from the virtual-to-physical mapping.

8. A memory controller for managing data in a storage device comprising a non-volatile memory having a plurality of jumbo blocks, each jumbo block having a separate and distinct physical block address, the memory controller configured to perform the operations of:
performing a folding operation on data associated with a first virtual address from a plurality of Single Level Cell (SLC) jumbo blocks of the non-volatile memory to one Multilevel Cell (MLC) jumbo block of the non-volatile memory;
receiving a read request to read data associated with a first logical block address;
identifying that the first virtual address is associated with the first logical block address;
determining whether a jumbo block associated with the first logical block address meets pre-SLC-overwrite criteria:
in response to a determination that the jumbo block associated with the first logical block address meets pre-SLC-overwrite criteria, reading data from the SLC jumbo block associated with the first virtual address;
in response to a determination that the jumbo block associated with the first logical block address does not meet pre-SLC-overwrite criteria, reading data from the MLC jumbo block associated with the first virtual address.

9. The memory controller of claim 8, wherein pre-SLC-overwrite criteria includes a criterion that is met when the SLC jumbo block corresponding to the logical block address has not been overwritten since the performing of the folding operation.

10. The memory controller of claim 8, wherein the memory controller is further configured to perform the operations of:
maintaining a virtual-to-intermediate-physical mapping of the correspondence between the first virtual address and physical address of a corresponding SLC jumbo block;
maintaining an intermediate route mapping indicating whether there is an SLC jumbo block associated with the first virtual address with retrievable data;
wherein pre-SLC-overwrite criteria includes a criterion that is met when the intermediate route mapping indicates that there is an SLC jumbo block associated with the first virtual address with retrievable data; and
in response to a determination that the intermediate route mapping indicates that there is an SLC jumbo block associated with the first virtual address with retrievable data, and before reading data from the SLC jumbo block associated with the first virtual address:
identifying the physical address of the SLC jumbo block from the virtual-to-intermediate physical mapping.

11. The memory controller of claim 10, wherein the memory controller is further configured to perform the operations of:
before receiving the read request, receiving a write request to write data to the non-volatile memory, and in response to receiving the write request:
writing data to the SLC jumbo block associated with the virtual block address and disassociating the SLC block with the virtual block address; and
updating the intermediate route mapping to indicate that data in the SLC jumbo block disassociated with the first virtual address is no longer retrievable such that the pre-SLC-overwrite criteria cannot be met.

12. The memory controller of claim 8, wherein the memory controller is further configured to perform the operations of:
maintaining a logical-to-virtual mapping of the correspondence between the respective logical and virtual address for each jumbo block of data and maintaining a virtual-to-physical mapping of the correspondence between the respective virtual and physical address for each jumbo block of data.

13. The memory controller of claim 12, wherein the memory controller is further configured to perform the operation of:
in response to performing the folding operation, updating the virtual-to-physical mapping to associate the respective virtual address for the data with the physical address of the MLC jumbo block.

14. The memory controller of claim 13, wherein the memory controller is further configured to perform the operation of:
in response to a determination that the jumbo block associated with the first logical block address does not meet pre-SLC-overwrite criteria, and before reading data from the MLC jumbo block associated with the first virtual address:
identifying the physical address of the MLC jumbo block from the virtual-to-physical mapping.

15. A data storage system for managing data in a storage device having a plurality of jumbo blocks, each jumbo block having a separate and distinct physical block address, the data storage system comprising:
a memory controller configured to perform the operations of:
performing a folding operation on data associated with a first virtual address from a plurality of Single Level Cell (SLC) jumbo blocks of the non-volatile memory to one Multilevel Cell (MLC) jumbo block of the non-volatile memory;
receiving a read request to read data associated with a first logical block address;
identifying that the first virtual address is associated with the first logical block address;
determining whether a jumbo block associated with the first logical block address meets pre-SLC-overwrite criteria:
in response to a determination that the jumbo block associated with the first logical block address meets pre-SLC-overwrite criteria, reading data from the SLC jumbo block associated with the first virtual address;
in response to a determination that the jumbo block associated with the first logical block address does not meet pre-SLC-overwrite criteria, reading data from the MLC jumbo block associated with the first virtual address.

16. The data storage system of claim 15, wherein pre-SLC-overwrite criteria includes a criterion that is met when the SLC jumbo block corresponding to the logical block address has not been overwritten since the performing of the folding operation.

17. The data storage system of claim 15, wherein the memory controller is further configured to perform the operations of:
maintaining a virtual-to-intermediate-physical mapping of the correspondence between the first virtual address and physical address of a corresponding SLC jumbo block;
maintaining an intermediate route mapping indicating whether there is an SLC jumbo block associated with the first virtual address with retrievable data;
wherein pre-SLC-overwrite criteria includes a criterion that is met when the intermediate route mapping indicates that there is an SLC jumbo block associated with the first virtual address with retrievable data; and
in response to a determination that the intermediate route mapping indicates that there is an SLC jumbo block associated with the first virtual address with retrievable data, and before reading data from the SLC jumbo block associated with the first virtual address:
identifying the physical address of the SLC jumbo block from the virtual-to-intermediate physical mapping.

18. The data storage system of claim 17, wherein the memory controller is further configured to perform the operations of:
before receiving the read request, receiving a write request to write data to the non-volatile memory, and in response to receiving the write request:
writing data to the SLC jumbo block associated with the virtual block address and disassociating the SLC block with the virtual block address; and
updating the intermediate route mapping to indicate that data in the SLC jumbo block disassociated with the first virtual address is no longer retrievable such that the pre-SLC-overwrite criteria cannot be met.

19. The data storage system of claim 18, wherein the memory controller is further configured to perform the operation of:
in response to performing the folding operation, updating the virtual-to-physical mapping to associate the respective virtual address for the data with the physical address of the MLC jumbo block.

20. The data storage system of claim 19, wherein the memory controller is further configured to perform the operation of:
in response to a determination that the jumbo block associated with the first logical block address does not meet pre-SLC-overwrite criteria, and before reading data from the MLC jumbo block associated with the first virtual address:
identifying the physical address of the MLC jumbo block from the virtual-to-physical mapping.

* * * * *